United States Patent
Hikichi et al.

(10) Patent No.: US 11,137,453 B2
(45) Date of Patent: Oct. 5, 2021

(54) STRESS COMPENSATION CONTROL CIRCUIT AND SEMICONDUCTOR SENSOR DEVICE

(71) Applicant: ABLIC Inc., Chiba (JP)

(72) Inventors: Tomoki Hikichi, Chiba (JP); Kentaro Fukai, Chiba (JP)

(73) Assignee: Ablic Inc., Chiba (JP)

( * ) Notice: Subject to any disclaimer, the term of this patent is extended or adjusted under 35 U.S.C. 154(b) by 136 days.

(21) Appl. No.: 16/742,336

(22) Filed: Jan. 14, 2020

(65) Prior Publication Data

US 2020/0233045 A1 Jul. 23, 2020

(30) Foreign Application Priority Data

Jan. 22, 2019 (JP) .............................. JP2019-008437

(51) Int. Cl.
*G01R 33/00* (2006.01)

(52) U.S. Cl.
CPC ................................ *G01R 33/0082* (2013.01)

(58) Field of Classification Search
None
See application file for complete search history.

(56) References Cited

U.S. PATENT DOCUMENTS

| 5,115,292 | A | 5/1992 | Takebe et al. |
| 7,980,138 | B2 | 7/2011 | Ausserlechner |
| 2009/0200613 | A1* | 8/2009 | Uemura .......... H01L 21/823412 257/368 |
| 2014/0009221 | A1* | 1/2014 | Motz .................. G01R 33/0082 327/564 |
| 2014/0026670 | A1* | 1/2014 | Fornara .............. G01R 31/2872 73/774 |
| 2016/0245668 | A1* | 8/2016 | Ausserlechner .......... G01L 1/26 |

FOREIGN PATENT DOCUMENTS

JP H02-184728 A 7/1990

* cited by examiner

*Primary Examiner* — Douglas X Rodriguez
(74) *Attorney, Agent, or Firm* — Crowell & Moring LLP

(57) ABSTRACT

A stress compensation control circuit of the present invention is provided which is capable of using a compensation error similar to that at room temperature even at a high temperature and reducing the area of a chip for a semiconductor sensor as compared with the related art. The stress compensation control circuit compensates for a change in detection sensitivity due to a stress to be applied to the semiconductor sensor. The stress compensation control circuit includes a stress compensation voltage generating circuit generating a stress compensation voltage corresponding to the applied stress in accordance with a difference between changes in transconductance due to stresses in a first depletion transistor and a first enhancement transistor, and performs compensation for the detection sensitivity in correspondence to the stress applied to the semiconductor sensor.

15 Claims, 7 Drawing Sheets

STRESS COMPENSATION CONTROL CIRCUIT AND SEMICONDUCTOR SENSOR DEVICE

RELATED APPLICATIONS

This application claims priority to Japanese Patent Application No. 2019-008437 filed on Jan. 22, 2019, the entire content of which is incorporated herein by reference.

BACKGROUND OF THE INVENTION

1. Field of the Invention

The present invention relates to a stress compensation control circuit and a semiconductor sensor device.

2. Description of the Related Art

In general, a resistance bridge type semiconductor sensor (hereinafter simply referred to as a semiconductor sensor) is formed on a semiconductor chip together with a driving circuit which drives itself.

The semiconductor chip is protected by a resin of a package by assembling it with packaging. For that reason, the semiconductor sensor is applied with a mechanical stress from the resin of the package because it is reduced upon solidification of the resin of the package.

Since the mechanical stress is applied where the semiconductor sensor is formed on the semiconductor chip as a resistance bridge configuration, detection sensitivity of the semiconductor sensor changes, and hence the strength of a magnetic field high in accuracy cannot be detected.

For example, a Hall element generates a detection voltage VH corresponding to the strength of a magnetic field by being supplied with a constant driving current. With the application of the mechanical stress, however, the detection sensitivity of the Hall element with respect to the strength of the magnetic field changes due to a piezo effect.

In view of the foregoing, there have been proposed techniques of correcting the driving current of the Hall element. One of the techniques of correcting the driving current of the Hall element has been disclosed in the Specification of U.S. Pat. No. 7,980,138. A device disclosed in the Specification of U.S. Pat. No. 7,980,138 detects an isotropic stress applied to the Hall element (chip) from a resin or the like by using a resistive element such as a diffusion resistance arranged in parallel to each of an X-axis and a Y-axis and compensates for the driving current of the Hall element in correspondence to the isotropic stress. With this, the detection sensitivity is compensated by canceling a change in the detection sensitivity of a magnetic field due to the stress applied to the Hall element, and detection high in magnetic field accuracy is performed.

SUMMARY OF THE INVENTION

Since, however, the diffusion resistance is used in the case of the disclosed configuration, a substrate leak current is large, and the amount of the current varies with the temperature, thereby increasing a compensation error in the case of a high temperature as compared with room temperature. Further, the diffusion resistance is required to increase the area for forming the resistance where the accuracy of its resistance value is made high, and hence the area of the chip is increased.

The present invention has been made in view of such circumstances, and it is an object of the present invention to provide a stress compensation control circuit and a semiconductor sensor device capable of realizing compensation accuracy similar to that at room temperature even at a high temperature and reducing the area of a chip for a semiconductor sensor as compared with the related art.

According to one aspect of the present invention, there is provided a stress compensation control circuit compensating for a change in detection sensitivity due to a stress to be applied to a semiconductor sensor, including a depletion transistor including a first depletion transistor having a channel direction parallel to a first direction and a second depletion transistor having a channel direction orthogonal to the first direction; and an enhancement transistor including a first enhancement transistor having a channel direction parallel to the first direction and a second enhancement transistor having a channel direction orthogonal to the first direction.

According to another aspect of the present invention, there is provided a semiconductor sensor device having a function of compensating for a change in detection sensitivity due to a stress to be applied to a semiconductor sensor, including the semiconductor sensor; and a stress compensation voltage generating circuit including a depletion transistor and an enhancement transistor, being configured to generate a stress compensation voltage corresponding to the applied stress in accordance with a difference between changes in transconductance due to stresses in the first depletion transistor and the first enhancement transistor, the depletion transistor including a first depletion transistor having a channel direction parallel to a first direction and a second depletion transistor having a channel direction orthogonal to the first direction, the enhancement transistor including a first enhancement transistor having a channel direction parallel to the first direction and a second enhancement transistor having a channel direction orthogonal to the first direction, the stress compensation voltage generating circuit being configured to output the stress compensation voltage.

According to at least one embodiment of the present invention, compensation accuracy similar to that at room temperature can be obtained in a wide temperature range, and the area of a chip for a semiconductor sensor can be reduced as compared with a stress compensation control circuit and a semiconductor sensor device as a related art.

DETAILED DESCRIPTION OF THE PREFERRED EMBODIMENTS

A stress compensation control circuit and a semiconductor sensor device according to each embodiment of the present invention will hereinafter be described with reference to the accompanying drawings.

First Embodiment

Figure 1:
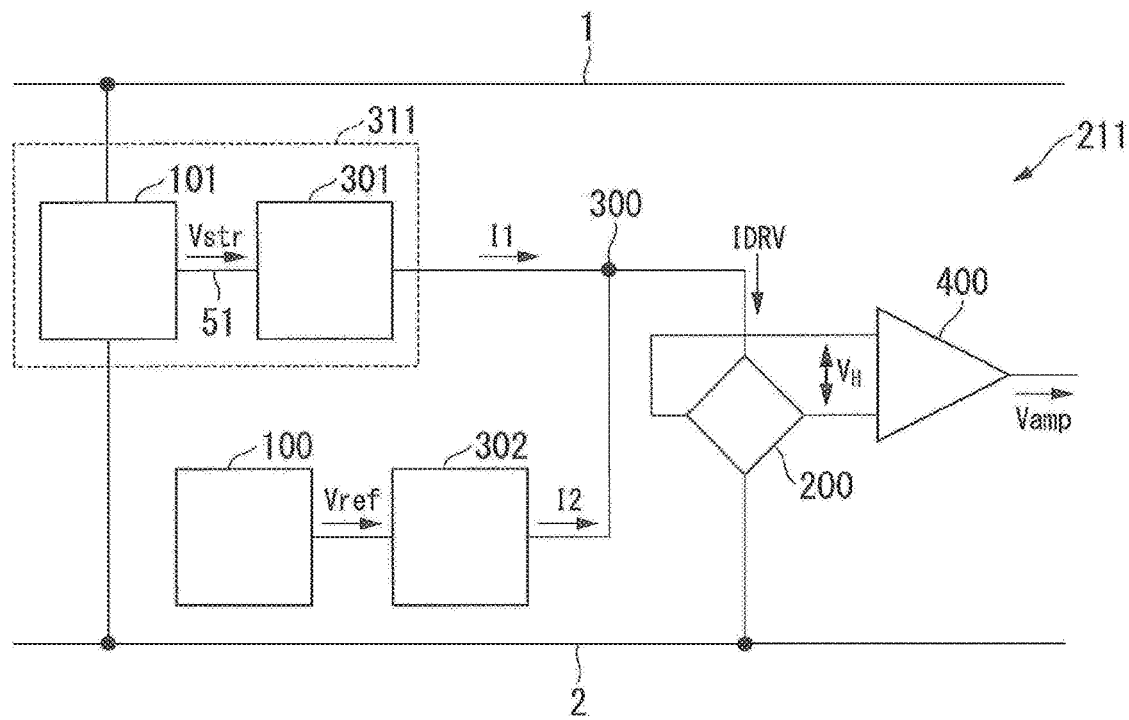
FIG. 1 is a circuit diagram illustrating an example of a semiconductor sensor device according to a first embodiment of the present invention.

FIG. 1 is a circuit diagram illustrating a semiconductor sensor device 211 serving as an example of a semiconductor sensor device according to a first embodiment. The present embodiment will be described using a Hall element as an example of a semiconductor sensor. However, the semiconductor sensor is not limited to the Hall element. The semiconductor sensor included in the semiconductor sensor device according to present embodiment may contain each kind of semiconductor sensor formed as a resistor bridge configuration such as the Hall element. According to the present embodiment, the sensitivity of detection of the semiconductor sensor can be compensated corresponding to a stress. Further; the compensation for the detection sensitivity of the Hall element in the present embodiment indicates that the detection sensitivity is controlled in such a manner that a constant detection value is obtained irrespective of the stress so far as the strength of the same magnetic field is concerned.

The semiconductor sensor device 211 includes a stress compensation control circuit 311 serving as an example of a stress compensation control circuit (hereinafter referred to as first stress compensation control circuit) according to a first embodiment, a reference voltage circuit 100, a voltage/current converting circuit 302, a Hall element 200, and an amplifier 400. The stress compensation control circuit 311 is a circuit which generates a compensation current I1 adjusting detection sensitivity of the Hall element 200 and compensating therefor in correspondence to a stress applied to the semiconductor sensor device 211, and includes a stress compensation voltage generating circuit 101 and a voltage/current converting circuit 301.

The reference voltage circuit 100 generates a preset reference voltage Vref and supplies the reference voltage Vref to the voltage/current converting circuit 302. The voltage/current converting circuit 302 voltage/current-converts (hereinafter referred to as V/I conversion) the reference voltage Vref supplied from the reference voltage circuit 100 and supplies the so-converted current I2 to the Hall element 200. The stress compensation voltage generating circuit 101 generates a compensation voltage Vstr of a voltage level corresponding to the stress applied thereto and supplies the generated compensation voltage Vstr to the voltage/current converting circuit 301. The voltage/current converting circuit 301 V/I-converts the compensation voltage Vstr supplied from the stress compensation voltage generating circuit 101 and supplies the converted compensation current I1 to the Hall element 200.

The Hall element 200 receives, as a driving current IDRV for driving itself, a current obtained by synthesizing the current I2 supplied from the voltage/current converting circuit 302 and the compensation current I1 supplied from the stress compensation control circuit 311 at a connecting point 300. Then, the Hall element 200 generates a detection voltage VH corresponding to a magnetic field vertical thereto, based on the supplied driving current IDRV and supplies the generated detection voltage VH to the amplifier 400. The amplifier 400 amplifies the detection voltage VH supplied from the Hall element 200 and supplies it to an external circuit as an amplified voltage Vamp.

In the present embodiment as described above, the compensation current I1 obtained by generating the compensation voltage Vstr in correspondence to the stress applied to a semiconductor chip formed with the semiconductor sensor device 211 and V/I converting the compensation voltage Vstr is added to the current I2 obtained by V/I converting the reference voltage Vref, and the Hall element 200 is driven by the so-obtained driving current IDRV. With this, since the driving current IDRV cancels a change in the detection sensitivity of the Hall element 200 due to the stress in correspondence to the stress, the detection sensitivity of the Hall element 200 can be compensated to be constant without depending on the stress.

A description will hereinafter be made as to the circuit configuration of the stress compensation voltage generating circuit 101 and the generation of its compensation voltage Vstr.

Figure 2:
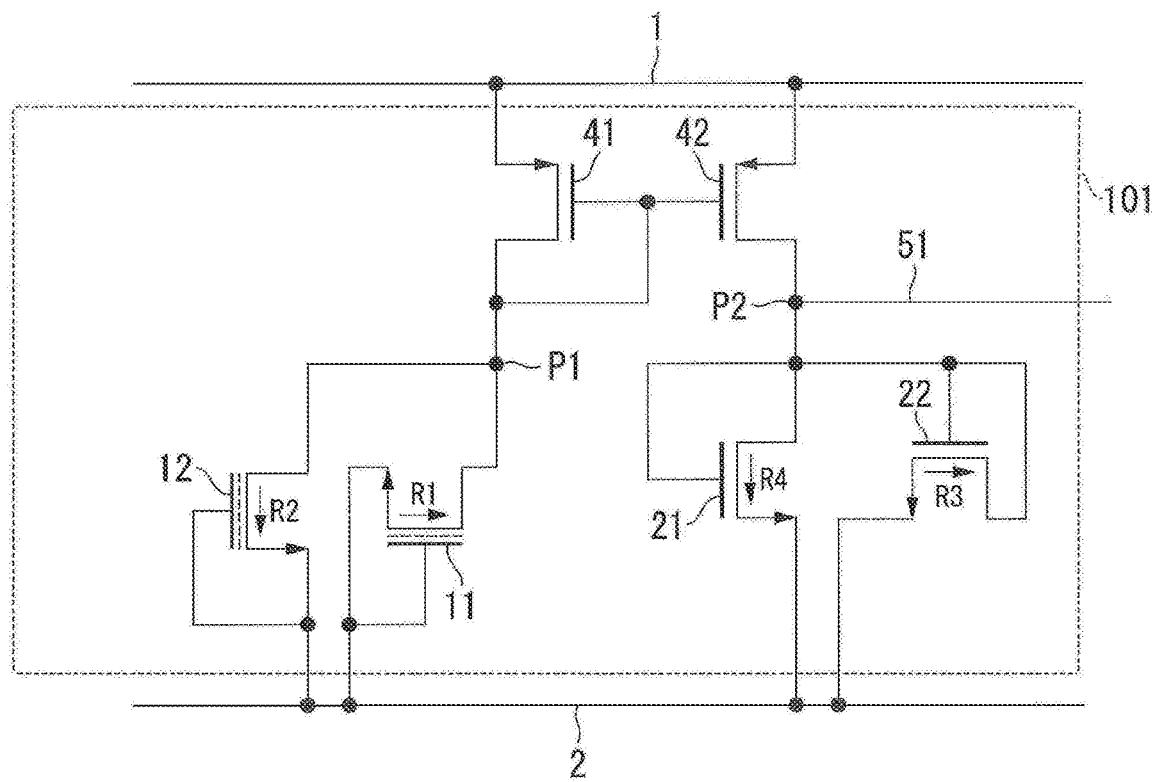
FIG. 2 is a circuit diagram illustrating a first circuit example of a stress compensation voltage generating circuit in a stress compensation control circuit according to the first embodiment.

FIG. 2 is a circuit diagram illustrating a first circuit example of the stress compensation voltage generating circuit in the first stress compensation control circuit. The stress compensation voltage generating circuit 101 illustrated in FIG. 2 is described as the first circuit example of the first stress compensation voltage generating circuit. The stress compensation voltage generating circuit 101 includes a current mirror circuit constituted of enhancement type P channel type MOS transistors (hereinafter referred to as P-ENH transistors) 41 and 42, depletion type N channel type MOS transistors (hereinafter referred to as N-DEP transistors) 11 and 12, and enhancement type N channel type MOS transistors (hereinafter referred to as N-ENH transistors) 21 and 22.

The P-ENH transistor 41 has a source connected to a VDD wiring 1, and a gate and a drain connected to drains of the N-DEP transistors 11 and 12 through a connecting point P1, The N-DEP transistor 11 and the N-DEP transistor 12 respectively have gates and sources connected to a VSS wiring 2. That is, the N-DEP transistor 11 and the N-DEP transistor 12 are arranged in parallel between the connecting point P1 and the VSS wiring 2.

The P-ENH transistor 42 has a source connected to the VDD wiring 1, a gate connected to a gate and a drain of the P-ENH transistor 41, and a drain connected to gates and drains of the N-ENH transistor 21 and the N-ENH transistor 22 through a connecting point P2. The N-ENH transistor 21 and the N-ENH transistor 22 respectively have sources connected to the VSS wiring 2. That is, the N-ENH transistor 21 and the N-ENH transistor 22, are arranged in parallel between the connecting point P2 and the VSS wiring 2. Further, the connecting point P2 is connected to a connecting point 300 in FIG. 1 through the voltage/current converting circuit 301 by a wiring 51.

The N-DEP transistor 11 and the N-DEP transistor 12 are formed on the semiconductor chip so that their mutual channel directions become orthogonal to each other. Here, the channel direction indicates a direction in which a drain-source current in a transistor flows, i.e., a direction parallel to a column in which the drain and source are arranged.

For example, in a two-dimensional (e.g. X-axis and Y-axis) orthogonal coordinate system, the N-DEP transistor 11 has a channel direction R1 parallel to an X-axis direction (first direction), and the N-DEP transistor 12 has a channel direction R2 parallel to a Y-axis direction (second direction). That is, the channel direction R1 of the N-DEP transistor 11 is a direction which is orthogonal to the channel direction R2 of the N-DEP transistor 12.

The N-ENH transistor 21 and the N-ENH transistor 22 are formed on the semiconductor chip so that their mutual channel directions become orthogonal to each other. For example, the N-ENH transistor 22 has a channel direction R3 parallel to the X-axis direction, and the N-ENH transistor 21 has a channel direction R4 parallel to the Y-axis direction. That is, the channel direction R3 of the N-ENH transistor 21 is a direction which is orthogonal to the channel direction R4 of the N-ENH transistor 22.

A description will next be made as to the relation between a stress applied to the transistor and a K value of a transconductance coefficient of a MOS transistor according to the stress (hereinafter, simply referred to as K value).

FIGS. 3A through 3G are diagrams describing a correspondence relation between a stress to be applied and a K value of a MOS transistor.

Figure 3A:
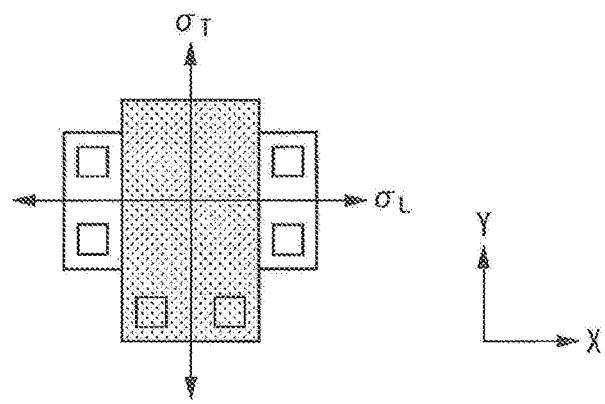
FIGS. 3A to 3G are a diagram describing a correspondence relation between a stress to be applied and a K value of a MOS transistor.

FIG. 3A is a diagram describing a correspondence relation between a channel direction and a stress. The channel direction R is parallel to an array of a drain D, a gate G, and a source S. In FIG. 3A, for example, each MOS transistor is formed on a chip in such a manner that the channel direction R becomes parallel to an X axis. In this case, the stress in an X-axis direction parallel to the channel direction R is a stress $\sigma_L$, and the stress in a Y-axis direction orthogonal to the channel direction R is a stress $\sigma_T$. On the other hand, in an arrangement in which each transistor is rotated by 90° with respect to the arrangement of each transistor in FIG. 3A, the stress in the X-axis direction becomes $\sigma_T$, and the stress in the Y-axis direction becomes $\sigma_L$.

The MOS transistor is disposed in the vicinity of the Hall element 200 in such a manner that the direction in which the current of the Hall element 200 flows has a tilt of 45° with respect to the channel direction (X-axis, Y-axis) of the MOS transistor.

Figure 3B:
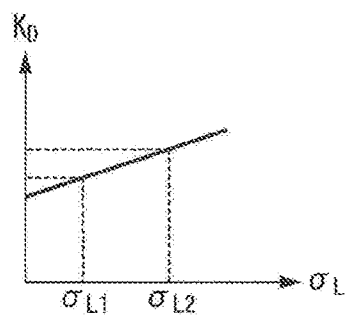

FIG. 3B is a graph illustrating a change in K value of an N-DEP transistor at the time that a stress $\sigma_L$ is applied in parallel to the channel direction, i.e., in parallel to the X-axis. In FIG. 3B, the horizontal axis indicates the stress $\sigma_L$ to be applied to the N-DEP transistor, and the vertical axis indicates a K value $K_D$ of the N-DEP transistor. In the case of $\sigma_L>0$, the stress is a tensile stress, and the K value increases as $\sigma_L$ becomes larger. On the other hand, in the case of $\sigma_L<0$, the stress is a compressive stress, and the K value is reduced as $\sigma_L$ becomes smaller. That is, the K value of the N-DEP transistor has dependence positive to a change in $\sigma_L$ (tilt $\alpha_L>0$).

Figure 3D:
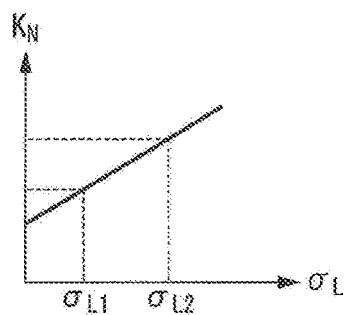
Figure 3F:
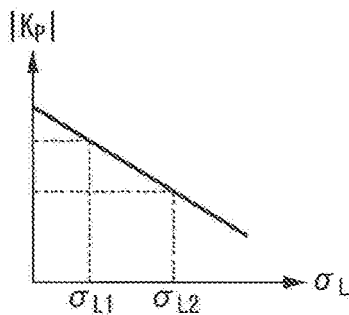
Figure 3C:
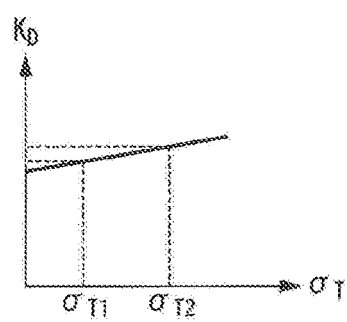

FIG. 3C is a graph illustrating a change in K value of an N-DEP transistor at the time that a stress $\sigma_T$ is applied at a right angle to the channel direction, i.e., in parallel to the Y-axis. In FIG. 3C, the horizontal axis indicates the stress $\sigma_T$ to be applied to the N-DEP transistor, and the vertical axis indicates a K value $K_D$ of the N-DEP transistor. In the case of $\sigma_T>0$, the stress is a tensile stress, and the K value increases as $\sigma_T$ becomes larger. On the other hand, in the case of $\sigma_T<0$, the stress is a compressive stress, and the K value is reduced as $\sigma_T$ becomes smaller (the absolute value of $\sigma_T$ becomes larger). That is, the K value of the N-DEP transistor has dependence positive to a change in $\sigma_T$ (tilt $\alpha_T>0$). Further, the N-DEP transistor has a relation of $\alpha_L>\alpha_T$.

FIG. 3D is a graph illustrating a change in K value of an N-ENH transistor at the time that a stress $\sigma_L$ is applied in parallel to the channel direction, i.e., in parallel to the X-axis. In FIG. 3D, the horizontal axis indicates the stress $\sigma_L$ to be applied to an N-ENH transistor, and the vertical axis indicates a K value $K_N$ of the N-ENH transistor (the change in $K_N$ relative to $\sigma_L$ is a tilt $\beta_L>0$).

Figure 3E:
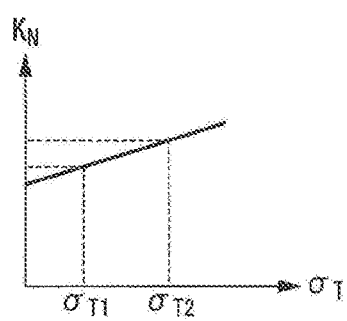

FIG. 3E is a graph illustrating a change in K value of an N-ENH transistor at the time that a stress $\sigma_T$ is applied at a right angle to the channel direction, i.e., in parallel to the Y-axis. In FIG. 3E, the horizontal axis indicates the stress $\sigma_T$ to be applied to the N-ENH transistor, and the vertical axis indicates a K value $K_N$ of the N-ENH transistor (the change in $K_N$ relative to $\sigma_T$ is a tilt $\beta_T>0$).

The K value of the N-ENH transistor has dependence positive to the change in $\sigma_L$ in a manner similar to the N-DEP transistor. In the N-ENH transistor, the tilts $\beta_L$ and $\beta_T$ of the changes in $\sigma_L$ and $\sigma_T$ are respectively larger than those of the N-DEP transistor ($\beta_L>\alpha_L$, $\beta_T>\alpha_T$). Further, the N-ENH transistor has a relation of $\beta_L>\beta_T$.

FIG. 3F is a graph illustrating a change in K value of a P-ENH transistor at the time that a stress $\sigma_L$ is applied in parallel to the channel direction, i.e., in parallel to the X-axis. In FIG. 3F, the horizontal axis indicates the stress $\sigma_L$ to be applied to the P-ENH transistor, and the vertical axis indicates a K value $|K_P|$ of the P-ENH transistor.

Figure 3G:
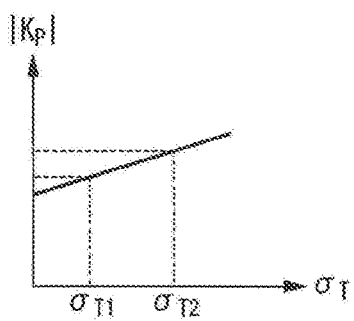

FIG. 3G is a graph illustrating a change in K value of a P-ENH transistor at the time that a stress $\sigma_T$ is applied at a right angle to the channel direction, i.e., in parallel to the Y-axis. In FIG. 3G, the horizontal axis indicates the stress $\sigma_T$ to be applied to the P-ENH transistor, and the vertical axis indicates a K value $|K_P|$ of the P-ENH transistor.

Contrary to the N-DEP transistor and the N-ENH transistor, the K value of the P-ENH transistor has dependence negative to the change in $\sigma_L$ ($\gamma_L<0$). On the other hand, the K value thereof has dependence positive to the change in $\sigma_T$. The P-ENH transistor has a relation of $\gamma_L<\gamma_T$.

Further, for the reasons mentioned below, in the stress compensation voltage generating circuit 101 of FIG. 2 which generates the compensation voltage Vstr in the present embodiment, the N-DEP transistor 11 and the N-DEP transistor 12 are respectively formed so that their channel directions are mutually orthogonal, and the N-ENH transistor 21 and the N-ENH transistor 22 are respectively formed so that their channel directions are mutually orthogonal. For example, in the case Where the N-DEP transistor and the N-ENH transistor are respectively formed so that their channel directions become parallel, the change in the K value varies in accordance with the stress $\sigma_L$ and the stress $\sigma_T$, and the generated compensation voltage Vstr has anisotropy depending on the direction of the stress.

With the characteristics of the stress directions and the K values in the MOS transistors described above, differential stresses diff equal in absolute value and different in sign depending on their channel directions are placed in an applied state.

On the other hand, in order to enhance the accuracy of compensation by the stress of the Hall element, there is a need to allow it to correspond to the change in K value due to the stress of the Hall element dependent on an isotropic stress.

With this view, in the present embodiment, the N-DEP transistor 11 and the N-DEP transistor 12, and the N-ENH transistor 21 and the N-ENH transistor 22 are respectively formed so that their channel directions are mutually orthogonal, and are respectively provided as transistor pairs (pairs of transistors), thereby canceling the change in K value due to the differential stress σdiff.

In the present embodiment, the compensation voltage Vstr is generated using the difference between the tilts of the changes corresponding to the stresses $\sigma_L$ and $\sigma_T$ in the above-described N-DEP transistor, N-ENH transistor and P-ENH transistor (the voltage level of the compensation voltage Vstr is adjusted), and the change in the detection sensitivity relative to the stress applied to the Hall element 200 is canceled using the compensation voltage Vstr.

That is, in the present embodiment, in the case where the voltage level of the compensation voltage Vstr is adjusted corresponding to the stress, and the detection sensitivity of the Hall element 200 is changed in a high direction depending on the stress, the voltage level of the compensation voltage Vstr is reduced to decrease the driving current IDRV of the Hall element 200 and thus reduce the detection sensitivity, thereby compensating for a rise in the detection sensitivity. On the other hand, in the case where the detection sensitivity of the Hall element 200 is changed in a low direction depending on the stress, the voltage level of the compensation voltage Vstr is made high to increase the driving current IDRV of the Hall element 200, thereby raising the detection sensitivity to compensate for a reduction in the detection sensitivity.

A description will hereinafter be made as to the generation of the compensation voltage Vstr in the first circuit example of the stress compensation voltage generating circuit 101.

Figure 4A:
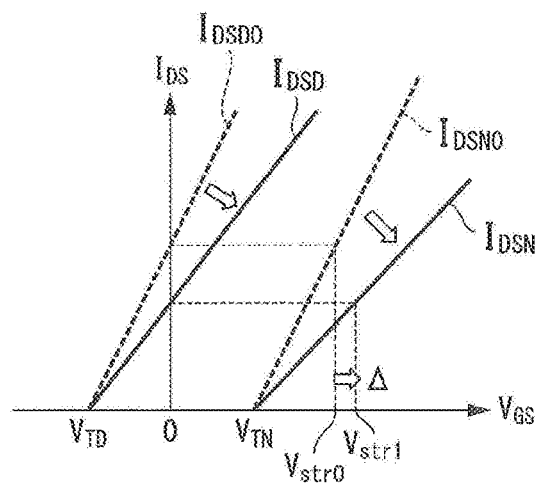
FIGS. 4A and 4B are diagrams describing changes corresponding to the stress in compensation voltage generated in the circuit example of the stress compensation voltage generating circuit.
Figure 4B:
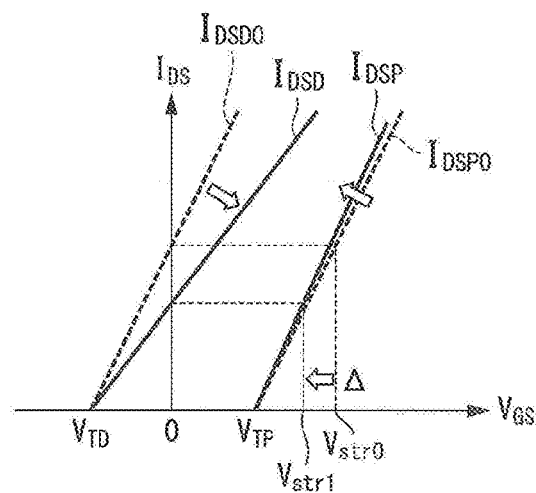

FIGS. 4A and 4B are diagrams describing a change corresponding to a stress, in the compensation voltage Vstr generated in the first circuit example of the stress compensation voltage generating circuit 101.

FIG. 4A is a graph illustrating the correspondence between the compensation voltage Vstr generated by the circuit of FIG. 2 and a drain-source current IDS. The vertical axis indicates the drain-source current IDS, and the horizontal axis indicates a gate-source voltage VGS. A voltage VTN is a threshold voltage of each of the N-ENH transistor 21 and the N-ENH transistor 22, and a voltage VTD is a threshold voltage of each of the N-DEP transistor 11 and the N-DEP transistor 12.

Drain-source currents flowing through the N-DEP transistor 11 and the N-DEP transistor 12 are summed and referred to as drain-source IDSD0 and IDSD. Here, the drain-source IDSD0 is a current value in an initial state, and the drain-source IDSD is a current value in a state (i.e., a state in which the compressive stress is applied) in which the stress $\sigma_L$ and the stress $\sigma_T$ each taken as the tensile stress are lowered than in the initial state.

Further, drain-source currents flowing through the N-ENH transistor 21 and the N-ENH transistor 22 are summed and referred to as drain-source IDSN0 and IDSN. Here, the drain-source IDSN0 is a current value in an initial state, and the drain-source IDSN is a current value in a state in which the stress $\sigma_L$ and the stress $\sigma_T$ each taken as the tensile stress are lowered.

As already described, the change amounts of the K values corresponding to the stresses $\sigma_L$ and $\sigma_T$ in the N-DEP transistor and the N-ENH transistor are different from each other.

For this reason, as can be seen from FIG. 4A, in the case where the tensile stress is lowered (i.e., the compressive stress is applied), a compression voltage Vstr0 generated in the first circuit example of the stress compensation voltage generating circuit 101 is increased by a voltage Δ due to the difference between the amounts of currents reduced in the N-DEP transistor 11 and the N-DEP transistor 12, and the N-ENH transistor 21 and the N-ENH transistor 22, and thereby becomes a compensation voltage Vstr1.

FIG. 4B is a graph illustrating the correspondence between a compensation voltage Vstr and a drain-source current IDS in the case where in the circuit of FIG. 2, the N-ENH transistor 21 and the N-ENH transistor 22 are replaced with the pair of the P-ENH transistors whose channel directions are formed at right angle to each other. The vertical axis indicates a drain-source current IDS, and the horizontal axis indicates a gate-source voltage VGS. A voltage VTP is a threshold voltage of each of the P-ENH transistor 41 and the P-ENH transistor 42, and a voltage VTD is a threshold voltage of each of the N-DEP transistor 11 and the N-DEP transistor 12.

A drain-source IDSD0 and a drain-source IDSD are similar to those in FIG. 4A.

Further, drain-source currents flowing through the P-ENH transistors (e.g., P-ENH transistors 31 and 32 to be described later) as a pair are summed and referred to as drain-source IDSP0 and IDSP. Here, the drain-source IDSP0 is a current value in an initial state, and the drain-source MSP is a current value in a state in which the stress $\sigma_L$ and the stress $\sigma_T$ is each taken as the compressive stress are applied.

The change amounts of K values corresponding to the stresses $\sigma_L$ and $\sigma_T$ each taken as the compressive stress in the N-DEP transistor and the P-ENH transistor, and their changes differ in polarity. For this reason, as can be seen from FIG. 4B, in the case where each of the stress $\sigma_L$ and the stress $\sigma_T$ is applied as the compressive stress, a compression voltage Vstr0 generated in the first circuit example of the stress compensation voltage generating circuit 101 is decreased by a voltage Δ due to a reduction in the amounts of currents in the N-DEP transistor 11 and the N-DEP transistor 12 and an increase in the amounts of currents in the pair of the P-ENH transistors, and thereby becomes a compensation voltage Vstr1.

Further, the above-described first circuit example has been described based on the configuration in which the N-DEP transistor 11 and the N-DEP transistor 12 are connected in parallel, and the N-ENH transistor 21 and the N-ENH transistor 22 are connected in parallel.

As another configuration, however, there may be a configuration in which as mentioned below, the N-DEP transistor 11 and the N-DEP transistor 12 are connected in series, and the N-ENH transistor 21 and the N-ENH transistor 22 are connected in series. As necessary, the another configuration will be hereinafter referred to as second circuit example of the stress compensation voltage generating circuit in the first stress compensation control circuit.

In this case, the N-DEP transistor 11 has a drain connected to a connecting point P1, a gate connected to a VSS wiring 2, and a source connected to a drain of the N-DEP transistor 12. The N-DEP transistor 12 has a gate and a source connected to the VSS wiring 2.

Further, the N-ENH transistor 21 has a drain and a gate connected to a connecting point P2, and a source connected to a drain of the N-ENH transistor 22. The N-ENH transistor 22 has a gate connected to the connecting point P2 and a source connected to the VSS wiring 2.

In the second circuit example, a compensation voltage Vstr corresponding to a stress to be applied can be generated as with the first circuit example.

In addition, as a further configuration example, there may be a configuration in which the N-ENH transistor 21 and the N-ENH transistor 22 are replaced with two P-ENH transistors whose channel directions are parallel to an X-axis and a Y-axis.

In the case of this configuration example, drain-source currents of the N-DEP transistor 11 and the N-DEP transistor 12 are reduced upon application of the stress $\sigma_L$ and the stress $\sigma_T$ as the compressive stresses. On the other hand, since a drain-source current of each P-ENH transistor increases, the compressive stress is increased, so that the compensation voltage Vstr is more reduced.

Even in other configuration examples, a compensation voltage Vstr corresponding to a stress to be applied can be generated as with the first circuit example. That is, the stress compensation voltage generating circuit of the first stress compensation control circuit is not limited to the stress compensation voltage generating circuit 101. The first stress compensation control circuit may include a stress compensation voltage generating circuit 103 or 105 which will be hereinafter described instead of the stress compensation voltage generating circuit 101.

Figure 5:
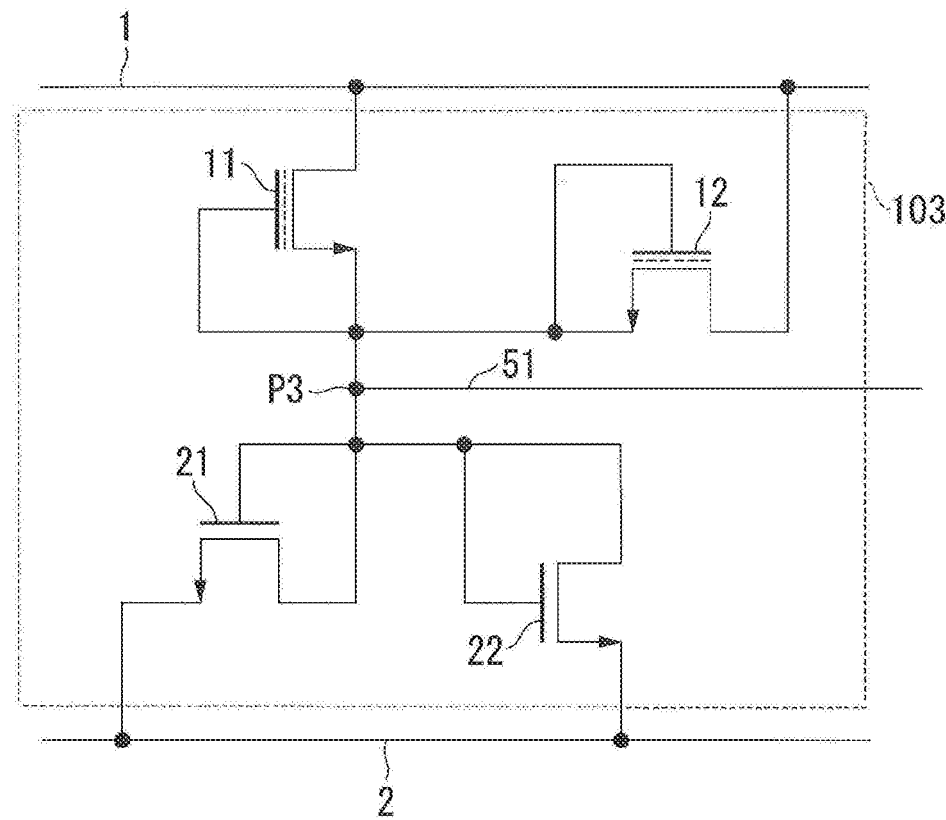
FIG. 5 is a circuit diagram illustrating a third circuit example of the stress compensation voltage generating circuit.

FIG. 5 is a circuit diagram illustrating a third circuit example of the stress compensation voltage generating circuit in the first stress compensation control circuit. In FIG. 5, the stress compensation voltage generating circuit 103 is described as the third circuit example of the stress compensation voltage generating circuit in the first stress compensation control circuit. The stress compensation voltage generating circuit 103 includes an N-DEP transistor 11 and an N-DEP transistor 12, and an N-ENH transistor 21 and an N-EN transistor 22.

The N-DEP transistor 11 and the N-DEP transistor 12 respectively have drains connected to a VDD wiring 1, and gates and sources connected to a connecting point P3.

That is, the N-DEP transistor 11 and the N-DEP transistor 12 are arranged in parallel between the VDD wiring 1 and the connecting point 3.

The N-ENH transistor 21 and the N-ENH transistor 22 respectively have gates and drains connected to the connecting point P3, and sources connected to a VSS wiring 2.

That is, the N-ENH transistor 21 and the N-ENH transistor 22 are arranged in parallel between the connecting point P3 and the VSS wiring 2.

Further, the connecting point P3 is connected to the connecting point 300 in FIG. 1 through the voltage/current converting circuit 301 by a wiring 51.

As described above, the parallel circuit of the N-DEP transistor 11 and the N-DEP transistor 12, and the parallel circuit of the N-ENH transistor 21 and the N-ENH transistor 22 are connected in series and connected in a totem pole manner.

As described in the first circuit example of the stress compensation voltage generating circuit 101, the drain-source IDSD of the N-DEP transistor 11 and the N-DEP transistor 12 are smaller than the drain-source IDSN of the N-ENH transistor 21 and the N-ENH transistor 22 in terms of the current amount to be lowered by the application of the stress $\sigma_L$ and the stress $\sigma_T$ as the compressive stresses.

For this reason, a compensation voltage Vstr provided from the connecting point P3 becomes larger as the stress $\sigma_L$ and the stress $\sigma_T$ as the compressive stresses increase and the tensile stress decreases), thus resulting in a change similar to the stress compensation voltage generating circuit 101 illustrated in FIG. 2.

A parallel circuit of one P-ENH transistor and the other P-ENH transistor different in polarity from the N-ENH transistor 21 and the N-ENH transistor 22 may further be connected in series with the totem-pole connection of the parallel circuit of the N-DEP transistor 11 and the N-DEP transistor 12 and the parallel circuit of the N-ENH transistor 21 and the N-ENH transistor 22 in FIG. 5. Here, the parallel circuit of one P-ENH transistor and the other P-ENH transistor is arranged between the sources of the N-ENH transistor 21 and the N-ENH transistor 22 and the VSS wiring 2.

Further, in the totem-pole connection of FIG. 5, the parallel circuit of the above-described one P-ENH transistor and other P-ENH transistor may be arranged in series between the sources (i.e., connecting point P3) of the N-DEP transistor 11 and the N-DEP transistor 12 and the drains and gates of the N-ENH transistor 21 and the N-ENH transistor 22.

The above-described one P-ENH transistor and other P-ENH transistor are formed so that one channel direction is perpendicular to the other direction. For example, the one P-ENH transistor is formed so that the channel direction becomes parallel to an X-axis direction, and the other P-ENH transistor is formed so that the channel direction becomes parallel to a Y-axis direction.

Upon the stress $\sigma_L$ and the stress $\sigma_T$ being applied as the compressive stresses by the above configuration, the drain-source current IDSP obtained by synthesizing the drain-source currents of the one P-ENH transistor and the other P-ENH transistor becomes large (FIG. 4B), whereas the drain-source current IDSD obtained by synthesizing the drain-source currents of the N-DEP transistor 11 and the N-DEP transistor 12 is reduced.

In view of the foregoing, the voltage level of the compensation voltage Vstr at the connecting point P3 can be arbitrarily controlled by controlling the ratio between the drain-source current IDSP and the drain-source current IDSD, and the compensation voltage Vstr can be generated with high accuracy by performing its fine adjustment. It is thus possible to simply supply the compensation voltage Vstr higher in accuracy, which compensates for the change in the detection accuracy due to the stress of the Hall element 200.

Figure 6:
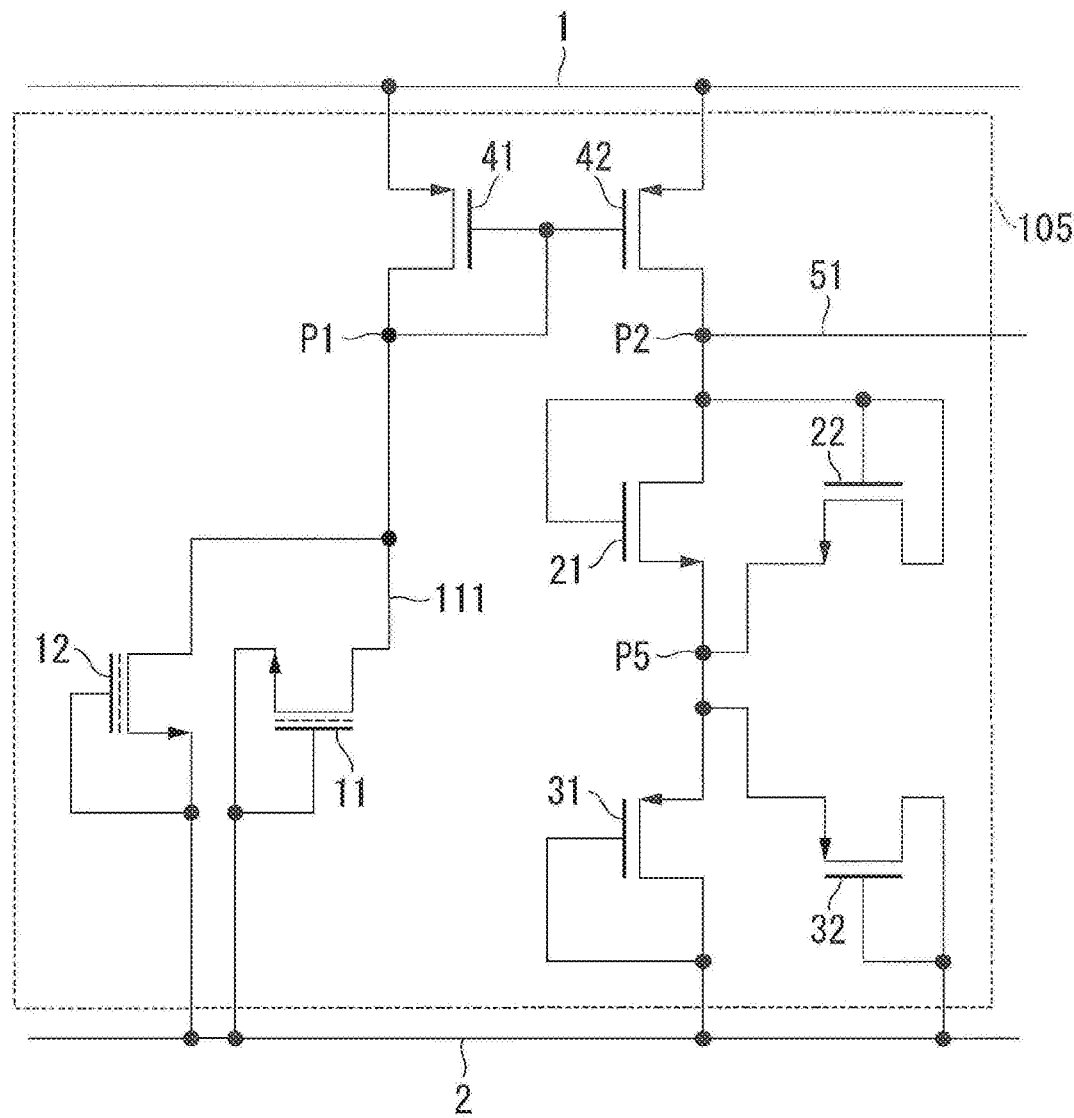
FIG. 6 is a circuit diagram illustrating a fourth circuit example of the stress compensation voltage generating circuit.

FIG. 6 is a circuit diagram illustrating a fourth circuit example of the stress compensation voltage generating circuit in the first stress compensation control circuit. In FIG. 6, the stress compensation voltage generating circuit 105 is described as the fourth circuit example of the stress compensation voltage generating circuit in the first stress compensation control circuit. The stress compensation voltage generating circuit 105 includes a circuit having the characteristics illustrated in FIG. 4B, which is added to the stress compensation voltage generating circuit 101 as the first circuit example. A description will hereinafter be made as to only a configuration in the fourth circuit example, which is different from that of the first circuit example. The added circuit is constituted of P-ENH transistors 31 and 32.

The N-ENH transistor 21 and the N-ENH transistor 22 respectively have the drains and gates connected to the connecting point P2, and the sources connected to a connecting point P5.

The P-ENH transistor 31 and the P-ENH transistor 32 respectively have sources connected to the connecting point PS, and gates and drains connected to the VSS wiring 2.

That is, the N-ENH transistor 21 and the N-ENH transistor 22 are connected in parallel between the connecting point P2 and the connecting point P5, and the P-ENH transistor 31 and the P-ENH transistor 32 are connected in parallel between the connecting point PS and the VSS wiring 2.

With this, by applying the stress $\sigma_L$ and the stress $\sigma_T$ as the compressive stresses, the drain-source current IDSP obtained by synthesizing the drain-source currents of the P-ENH transistor 31 and the P-ENH transistor 32 becomes large (FIG. 4B), whereas the drain-source current IDSD obtained by synthesizing the drain-source currents of the N-DEP transistor 11 and the N-DEP transistor 12 is reduced.

In view of the foregoing, the voltage level of the compensation voltage Vstr at the connecting point P2 can be arbitrarily controlled by controlling the ratio between the drain-source current IDSP and the drain-source current IDSD. In comparison with the stress compensation voltage generating circuits 101 and 103, the compensation voltage Vstr can be generated with high accuracy by performing its fine adjustment. It is thus possible to simply supply the compensation voltage Vstr higher in accuracy, which compensates for the change in the detection accuracy due to the stress of the Hall element 200.

Incidentally, the present embodiment has been described as the configuration in which the reference voltage circuit 100 generates the reference voltage Vref, the voltage/current converting circuit 302 generates the current I2 from the reference voltage Vref, and the compensation current I1 is synthesized with the current I2 to generate the driving current IDRV to drive the Hall element 200.

There may however be adopted a configuration in which the compensation voltage Vstr generated by the stress compensation control circuit 311 directly without providing the reference voltage circuit 100 and the voltage/current converting circuit 302 is converted into the compensation current I1 by the voltage/current converting circuit 301, and the compensation current I1 is supplied to the Hall element 200 as the driving current IDRV.

Further, in the present embodiment, the driving current IDRV corresponding to the stress is supplied from the stress compensation control circuit 311 to the Hall element 200, but the driving voltage VDRV applied to the Hall element 200 may be changed corresponding to the stress.

There may be, for example, a configuration in which the driving current IDRV is I/V (current/voltage)-converted (hereinafter referred to as I/V-conversion) into a voltage, and the voltage is applied to the Hall element 200 via a voltage regulator as the driving voltage VDRV. With this, the change in the detection sensitivity due to the stress of the Hall element 200 is compensated by the driving voltage VDRV changed corresponding to the stress.

Second Embodiment

Figure 7:
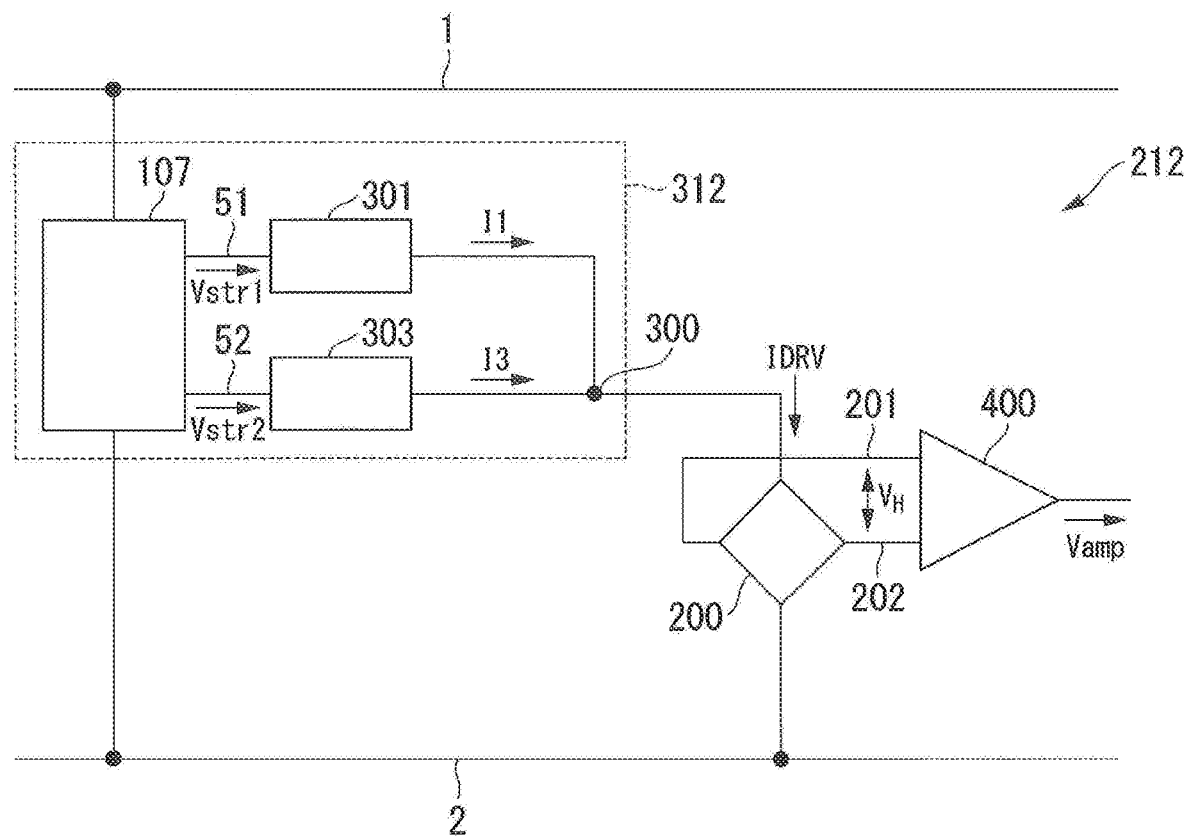
FIG. 7 is a circuit diagram illustrating an example of a semiconductor sensor device according to a second embodiment of the present invention.

FIG. 7 is a circuit diagram illustrating a semiconductor sensor device 212 serving as an example of a semiconductor sensor device according to a second embodiment. In the second embodiment, the same components as in the first embodiment are denoted by the same reference numerals, and descriptions thereof will be simplified or omitted. In FIG. 7, the semiconductor sensor device 212 includes a stress compensation control circuit 312, a Hall element 200, and an amplifier 400.

The stress compensation control circuit 312 has a stress compensation voltage generating circuit 107 and voltage/current converting circuits 301 and 303.

The stress compensation control circuit 312 synthesizes a compensation current I1 provided from the voltage/current converting circuit 301 with a compensation current I3 provided from the voltage/current converting circuit 303 and supplies the so-synthesized current to the Hall element 200 as a driving current IDRV.

Then, the amplifier 400 amplifies a detection voltage VH supplied from the Hall element 200 and supplies the same to an external circuit as an amplified voltage Vamp.

Figure 8:
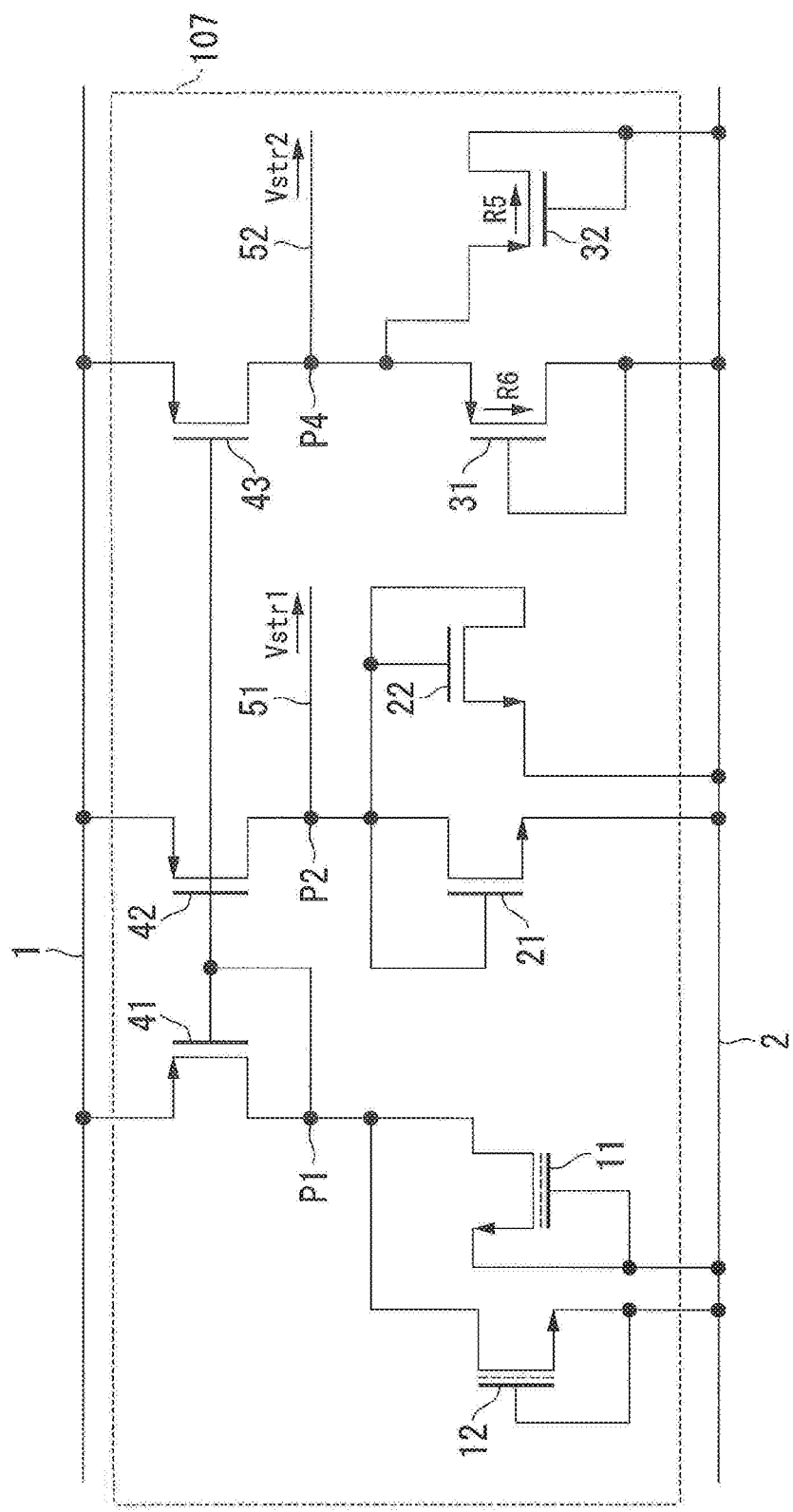
FIG. 8 is a circuit diagram illustrating an example of a stress compensation voltage generating circuit in a stress compensation control circuit according to the second embodiment.

FIG. 8 is a circuit diagram illustrating an example of the stress compensation voltage generating circuit according to the second embodiment of the present invention. The stress compensation voltage generating circuit 107 has a circuit having the characteristics illustrated in FIG. 4B, which is added to the first circuit example (stress compensation voltage generating circuit 101) in the first embodiment. A description will hereinafter be made as to only a configuration different from that of the first circuit example (stress compensation voltage generating circuit 101) in the stress compensation voltage generating circuit 107. The added circuit has a P-ENH transistor 43 and P-ENH transistors 31 and 32.

The P-ENH transistor 43 has a source connected to a VDD wiring 1, a gate connected to a connecting point P1, and a drain connected to a connecting point P4.

The P-ENH transistor 31 and the P-ENH transistor 32 respectively have sources connected to the connecting point P4 and gates and drains connected to a VSS wiring 2. That is, the P-ENH transistor 31 and the P-ENH transistor 32 are arranged in parallel between the connecting point P4 and the VSS wiring 2. The P-ENH transistor 32 has a channel direction R5 parallel to an X-axis direction, and the P-ENH transistor 31 has a channel direction R6 parallel to a Y-axis direction.

With this, by applying the stress $\sigma_L$ and the stress $\sigma_T$ as the compressive stresses, a drain-source current IDSP obtained by synthesizing drain-source currents of the P-ENH transistor 31 and the P-ENH transistor 32 becomes large as the stress $\sigma_L$ and the stress $\sigma_T$ become smaller, whereby the compensation voltage Vstr is reduced as illustrated in FIG. 4B.

In view of the foregoing, upon the stress $\sigma_L$ and the stress $\sigma_T$ being applied as the compressive stresses, a compensation voltage Vstr1 supplied from a connecting point P2 rises, whereas a compensation voltage Vstr2 supplied from the connecting point P4 is lowered.

Then, as illustrated in FIG. 7, the voltage/current converting circuit 301 V/I-converts the compensation voltage Vstr1 supplied from the stress compensation voltage generating circuit 107 through a wiring 51 (connecting point P2 in FIG. 8), and multiplies the so-obtained current by a predetermined ratio p to provide the compensation current I1. Further, the voltage/current converting circuit 303 V/I-converts the compensation voltage Vstr2 supplied from the stress compensation voltage generating circuit 107 through a wiring 52 (connecting point P4 in FIG. 8), and multiplies the so-obtained current by a predetermined ratio q to provide the compensation current I3.

With this in view, the compensation current I1 obtained by multiplying the current obtained by V/I-converting the compensation voltage Vstr1 by the predetermined ratio p, and the compensation current I3 obtained by multiplying the current obtained by V/I-converting the compensation voltage Vstr2 by the predetermined ratio q are synthesized to generate the driving current IDRV.

In the present embodiment, the voltage/current converting circuits 301 and 303 respectively provide the compensation currents I1 and I3 as predetermined current values in accordance with the predetermined ratios p and q.

In view of the foregoing, the stress compensation control circuit 312 arbitrarily changes the above-described ratios p and q to generate the compensation currents I1 and I3 from the compensation voltages Vstr1 and Vstr2 with high accuracy while finely adjusting them, thereby enabling the highly accurate driving current IDRV to be supplied to the Hall element 200. It is thus possible to compensate for a change in the detection accuracy due to the stress of the Hall element 200 with high accuracy.

Incidentally, the driving voltage VDRV to be applied to the Hall element 200 may be changed corresponding to the stress as with the first embodiment.

Third Embodiment

Figure 9:
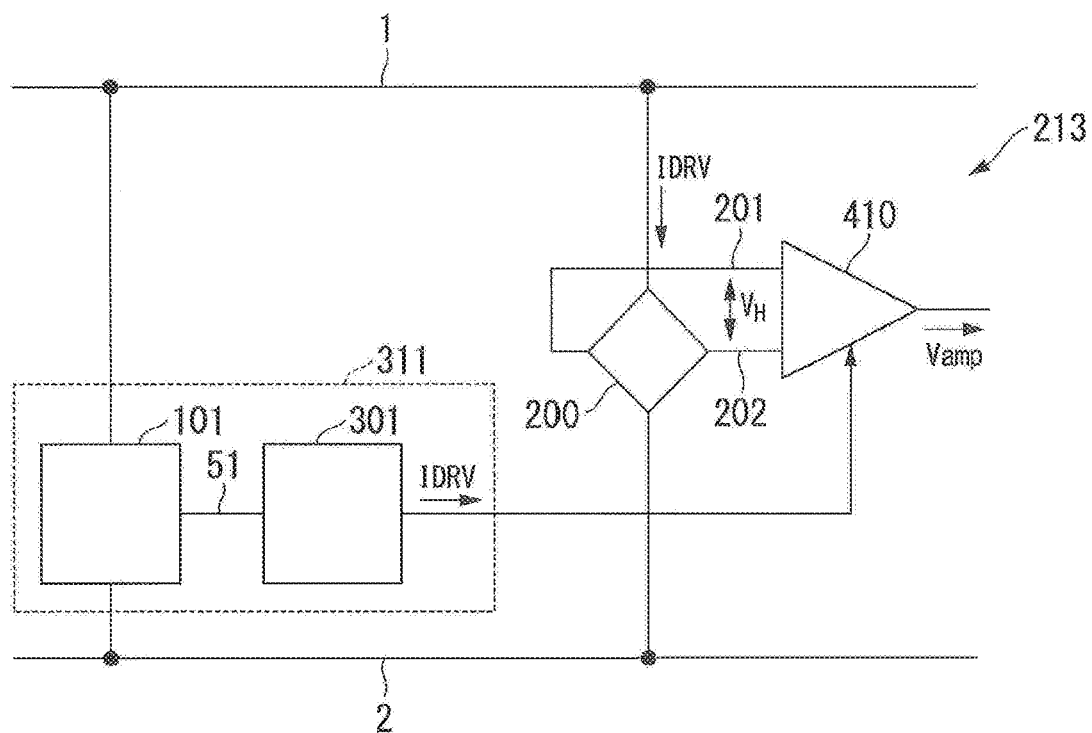
FIG. 9 is a circuit diagram illustrating an example of a semiconductor sensor device according to a third embodiment.

FIG. 9 is a circuit diagram illustrating a semiconductor sensor device 213 serving as an example of a semiconductor sensor device according to a third embodiment. In the third embodiment, the same components as in the first and second embodiments are denoted by the same reference numerals, and descriptions thereof will be simplified or omitted. In FIG. 9, the semiconductor sensor device 213 includes a stress compensation control circuit 311, a Hall element 200, and an amplifier 410.

Since the stress compensation control circuit 311 is similar to the circuit illustrated in FIG. 1 in the first embodiment, its description will be omitted. A description will hereinafter be made as to only configurations and operations different from those in the first embodiment.

The Hall element 200 is provided between a VDD wiring 1 and a VSS wiring 2 and supplied with a driving current IDRV from the VDD wiring 1.

In FIG. 9, the stress compensation control circuit 311 generates a driving current IDRV corresponding to the stress $\sigma_L$ and the stress $\sigma_T$ as an operating current of the amplifier 410.

Here, the amplifier 410 changes an amplification factor in accordance with a change in the driving current IDRV supplied from the stress compensation control circuit 311.

In view of the foregoing, in the present embodiment, it is possible to change the amplification factor of the amplifier 410 corresponding to the stress $\sigma_L$ and the stress $\sigma_T$ and compensate for a change in detection sensitivity of the Hall element 200 due to the stress.

Fourth Embodiment

Figure 10:
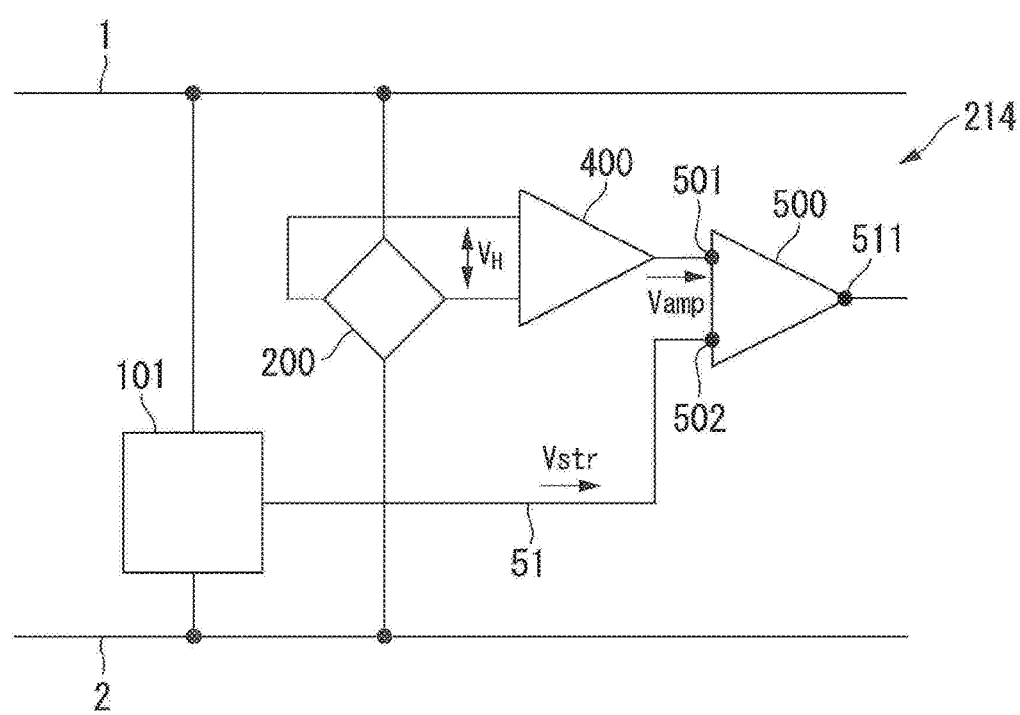
FIG. 10 is a circuit diagram illustrating an example of a semiconductor sensor device according to a fourth embodiment.

FIG. 10 is a circuit diagram illustrating an example of a semiconductor sensor device according to a fourth embodiment. In the fourth embodiment, the same components as in the first to third embodiments are denoted by the same reference numerals, and descriptions thereof will be simplified or omitted. In FIG. 10, the semiconductor sensor device 214 includes a stress compensation voltage generating circuit 101, a Hall element 200, an amplifier 400, and a comparator 500.

The comparator 500 includes an input voltage terminal 501 supplied with an amplified voltage Vamp from the amplifier 400, a reference voltage terminal 502 supplied with a compensation voltage Vstr provided from the stress compensation voltage generating circuit 101, and an output terminal 511.

As already described, since the detection sensitivity of the Hall element 200 changes and the detection voltage VH supplied from the Hall element 200 changes with the changing of the stress $\sigma_L$ and the stress $\sigma_T$ to be applied, the amplified voltage Vamp supplied from the amplifier 400 also changes in conjunction therewith.

In the present embodiment, the compensation voltage Vstr is used as a reference voltage to be compared with the amplified voltage Vamp. The comparator 500 compares the compensation voltage Vstr as the reference voltage of the comparator 500 with the amplified voltage Vamp proportional to the detection voltage VH, determines whether the detection voltage VH is a prescribed measured value or not, and then outputs a signal corresponding to a determination result from the output terminal 511 to an external circuit.

Thus, the present embodiment can compensate for the change in the amplified voltage Vamp supplied from the amplifier 400 and obtained by amplifying the detection voltage VH which occurs due to the change in the detection sensitivity of the Hall element 200.

That is, it is necessary to provide a detection signal from the semiconductor sensor device 214 without depending on the stress applied to the semiconductor sensor device 214 where a magnetic field applied to the Hall element 200 becomes a prescribed strength. For that reason, in the present embodiment, the change in the detection sensitivity of the Hall element 200 due to the stress is compensated by changing the reference voltage of the comparator 500 in correspondence to the stress.

According to the first to fourth embodiments described above, without compensating for the detection sensitivity of the semiconductor sensor changed due to the stress applied to the semiconductor sensor device by using the diffusion resistance as in the related art, the change in the detection sensitivity due to the stress of the semiconductor device is compensated by adjusting and generating the compensation voltage in correspondence to the stress in accordance with the difference between the amounts of changes in transconductance due to the stresses in the depletion transistor and the enhancement transistor. It is therefore possible to achieve the compensation accuracy similar to that at room temperature in a wide temperature range and compensate for the detection sensitivity with high accuracy without causing a leakage current to flow even at a high temperature as in the diffusion resistor. Further, since the area for forming each of the depletion transistor and the enhancement transistor is smaller than that for the diffusion resistor, the area of the chip for the semiconductor sensor device can be reduced as compared with the related art. Incidentally, the semiconductor sensor devices 212 to 214 may include the stress compensation voltage generating circuit 103, 105 or 107 instead of the stress compensation voltage generating circuit 101.

It is noted that the present invention is not limited to the above-described embodiments as they are and, in an implementation phase, can be embodied in various forms other than the specific embodiments described above. Various omissions, additions, substitutions, and changes may be made without departing from the spirit and scope of the invention. These embodiments and modifications thereof are included within the spirit and scope of the invention and are included within the scope of the invention as disclosed in the claims and equivalents thereof.

What is claimed is:

1. A stress compensation control circuit compensating for a change in detection sensitivity due to a stress to be applied to a semiconductor sensor, comprising:
a depletion transistor including a first depletion transistor having a channel direction parallel to a first direction and a second depletion transistor having a channel direction orthogonal to the first direction; and
an enhancement transistor including a first enhancement transistor having a channel direction parallel to the first direction and a second enhancement transistor having a channel direction orthogonal to the first direction.

2. The stress compensation control circuit according to claim 1, further comprising:
a third enhancement transistor connected in series with the depletion transistor, and
a fourth enhancement transistor connected in series with the enhancement transistor,
wherein the third and fourth enhancement transistors constitute a current mirror circuit.

3. The stress compensation control circuit according to claim 2, further comprising a fifth enhancement transistor connected in series with the enhancement transistor and different in polarity from the enhancement transistor.

4. The stress compensation control circuit according to claim 3, further comprising a voltage/current converting circuit configured to convert a voltage generated by the stress to be applied to the semiconductor sensor in the depletion transistor and the enhancement transistor into a driving current of the semiconductor sensor and supply the driving current to the semiconductor sensor.

5. The stress compensation control circuit according to claim 3, further comprising:
an amplifier amplifying a detection voltage of the semiconductor sensor; and
a voltage/current converting circuit configured to convert the detection voltage of the semiconductor sensor into a driving current of the amplifier and supply the driving current to the amplifier.

6. The stress compensation control circuit according to claim 2, further comprising a voltage/current converting circuit configured to convert a voltage generated by the stress to be applied to the semiconductor sensor in the depletion transistor and the enhancement transistor into a driving current of the semiconductor sensor and supply the driving current to the semiconductor sensor.

7. The stress compensation control circuit according to claim 2, further comprising:
an amplifier amplifying a detection voltage of the semiconductor sensor; and
a voltage/current converting circuit configured to convert the detection voltage of the semiconductor sensor into a driving current of the amplifier and supply the driving current to the amplifier.

8. The stress compensation control circuit according to claim 1, wherein the depletion transistor and the enhancement transistor are connected in series with each other as a totem-pole connection.

9. The stress compensation control circuit according to claim 8, further comprising a voltage/current converting circuit configured to convert a voltage generated by the stress to be applied to the semiconductor sensor in the depletion transistor and the enhancement transistor into a driving current of the semiconductor sensor and supply the driving current to the semiconductor sensor.

10. The stress compensation control circuit according to claim 8, further comprising:
an amplifier amplifying a detection voltage of the semiconductor sensor; and
a voltage/current converting circuit configured to convert the detection voltage of the semiconductor sensor into a driving current of the amplifier and supply the driving current to the amplifier.

11. The stress compensation control circuit according to claim 1, further comprising a voltage/current converting circuit configured to convert a voltage generated by the stress to be applied to the semiconductor sensor in the depletion transistor and the enhancement transistor into a driving current of the semiconductor sensor and supply the driving current to the semiconductor sensor.

12. The stress compensation control circuit according to claim 1, further comprising:
an amplifier amplifying a detection voltage of the semiconductor sensor; and
a voltage/current converting circuit configured to convert the detection voltage of the semiconductor sensor into a driving current of the amplifier and supply the driving current to the amplifier.

13. The stress compensation control circuit according to claim 1, further comprising a comparator including an input voltage terminal from which the detection voltage of the semiconductor sensor is supplied, a reference voltage terminal from which a voltage generated by the stress to be applied to the semiconductor sensor in the depletion transistor and the enhancement transistor is supplied, and an output terminal to which a signal corresponding to a determination whether the detection voltage of the semiconductor sensor is a prescribed measured value or not is provided.

14. The stress compensation control circuit according to claim 1, the semiconductor sensor is configured to drive by using a voltage generated by the stress to be applied to the semiconductor sensor as a drive voltage.

15. A semiconductor sensor device having a function of compensating for a change in detection sensitivity due to a stress to be applied to a semiconductor sensor, comprising:
the semiconductor sensor; and
a stress compensation voltage generating circuit including a depletion transistor and an enhancement transistor, being configured to generate a stress compensation voltage corresponding to the applied stress in accordance with a difference between changes in transconductance due to stresses in the first depletion transistor and the first enhancement transistor,
the depletion transistor including a first depletion transistor having a channel direction parallel to a first direction and a second depletion transistor having a channel direction orthogonal to the first direction,
the enhancement transistor including a first enhancement transistor having a channel direction parallel to the first direction and a second enhancement transistor having a channel direction orthogonal to the first direction,
the stress compensation voltage generating circuit being configured to output the stress compensation voltage.

* * * * *